United States Patent
Mabuchi

(10) Patent No.: US 8,013,336 B2
(45) Date of Patent: *Sep. 6, 2011

(54) SOLID-STATE IMAGING DEVICE, METHOD OF DRIVING SAME, AND CAMERA APPARATUS

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/633,284

(22) Filed: Dec. 4, 2006

(65) Prior Publication Data

US 2007/0076110 A1    Apr. 5, 2007

Related U.S. Application Data

(62) Division of application No. 10/845,288, filed on May 13, 2004, now Pat. No. 7,187,020.

(30) Foreign Application Priority Data

May 16, 2003 (JP) .................................. 2003-138947

(51) Int. Cl.
*H01L 29/04* (2006.01)
(52) U.S. Cl. ............. 257/59; 257/72; 257/258; 257/222
(58) Field of Classification Search .................... 257/83, 257/59, 72, 258, 222

See application file for complete search history.

(56) References Cited

U.S. PATENT DOCUMENTS

| | | | | |
|---|---|---|---|---|
| 5,739,562 A | * | 4/1998 | Ackland et al. | 257/291 |
| 6,940,059 B2 | * | 9/2005 | Mabuchi | 250/208.1 |
| 2003/0169354 A1 | * | 9/2003 | Aotsuka | 348/272 |

FOREIGN PATENT DOCUMENTS

| | | |
|---|---|---|
| JP | 10-248033 | 9/1998 |
| JP | HEI 10-248033 | 9/1998 |
| JP | 11-112018 | 4/1999 |
| JP | HEI 11-112018 | 4/1999 |
| JP | 2002-051263 | 2/2002 |

* cited by examiner

*Primary Examiner* — Wai-Sing Louie
*Assistant Examiner* — Bilkis Jahan
(74) *Attorney, Agent, or Firm* — Robert J. Depke; Rockey, Depke & Lyons, LLC

(57) ABSTRACT

A solid-state imaging device of a three-transistor pixel configuration having no selection transistor has a problem of a non-selection hot carrier white point, which is specific to this apparatus. A bias current during a non-reading period of pixels is made to flow to a pixel associated with an immediately previous selection pixel, for example, the immediately previous selection pixel itself. As a result, dark current only for one line occurs in each pixel, and the dark current for one line itself can be reduced markedly. Consequently, defective pixels due to non-selection hot carrier white points can be virtually eliminated.

5 Claims, 16 Drawing Sheets

◩ LOW CHANNEL PIXEL
  OF EACH COLUMN

SOLID-STATE IMAGING DEVICE, METHOD OF DRIVING SAME, AND CAMERA APPARATUS

The subject matter of application Ser. No. 10/845,288, is incorporated herein by reference. The present application is a divisional of U.S. Ser. No. 10/845,288, filed May 13, 2004, now U.S. Pat. No. 7,187,020 which claims priority to Japanese Patent Application Number 2003-138947 filed May 16, 2003, all of which are incorporated herein by reference.

BACKGROUND OF THE INVENTION

1. Field of the Invention

The present invention relates to a solid-state imaging device, a method of driving the solid-state imaging device, and a camera apparatus. More particularly, the present invention relates to an X-Y address type solid-state imaging device typified by a MOS-type solid-state imaging device, a method of driving the solid-state imaging device, and a camera apparatus (image-capturing apparatus) that uses the solid-state imaging device as an image-capturing device.

2. Description of the Related Art

In an X-Y address type solid-state imaging device, for example, a MOS-type solid-state imaging device, in order to microfabricate unit pixels, a selection transistor for selecting a pixel is omitted, and a pixel is selected by controlling the electrical potential of a floating diffusion section (hereinafter referred to as an "FD section") by a resetting transistor for resetting the FD section, so that the unit pixel is realized by three transistors (see, for example, Japanese Unexamined Patent Application Publication No. 2002-51263, in particular, paragraph numbers 0010 to 0012, and FIG. 1).

The configuration of a pixel circuit of three transistors is shown in FIG. 15. As can be seen from FIG. 15, a unit pixel 100 includes an optoelectric transducer (here, photodiode) 101, a transfer transistor 102, an amplifier transistor 103, and a resetting transistor 104. A large number of unit pixels 100 are arranged two-dimensionally in a matrix on a semiconductor substrate.

As is clear from the above-described configuration, in the pixel circuit of three transistors, a selection transistor does not exist, and the pixel is selected by controlling the electrical potential of an FD section 105 by the resetting transistor 104. That is, for a non-selection pixel, the electrical potential of the FD section 105 is brought into a low level (hereinafter referred to as an ""L" level"), and for a selection pixel, the electrical potential of the FD section 105 is brought into a high level (hereinafter referred to as an ""H" level"), thereby outputting a signal of the selection pixel to a vertical signal line 107. Thereafter, by returning the electrical potential of the FD section 105 of the selection pixel to an "L" level, the pixel is returned to a non-selection state. This operation is performed simultaneously on pixels for one line.

In the pixel circuit of three transistors of the above-described configuration, the drain side of an amplifier transistor 103 is simply connected to power-supply wiring, and the drain side of the resetting transistor 104 is connected to drain wiring 108 which extends in the row direction (horizontal direction). In comparison, as shown in FIG. 16, as a result of adopting a configuration in which the drain side of the amplifier transistor 103 and the drain side of the resetting transistor 104 are connected commonly to the drain wiring, a contact, a diffusion layer, and wiring in the unit pixel 100 can be reduced. Thus, this is advantageous when the unit pixel 100 is formed more finely.

Although the drain wiring is not shown in FIG. 16, similarly to the case of FIG. 15, in the case of drain wiring extending in the row direction, the number of wirings extending in the row direction is three, and the number of wirings extending in the column direction (vertical direction) is one. As a result, it is difficult to form an opening for receiving incident light into the pixel, into a shape close to a square. Furthermore, since the electrical current of all the vertical signal lines 107 is supplied from one drain wiring, and large electrical current flows through the drain wiring, wiring resistance and wiring reliability become problems. These problems can be avoided by forming the drain wiring as wiring in the vertical direction or in a lattice form.

A description will now be given of a case in which the solid-state imaging device of the pixel configuration of FIG. 16 is driven. In the period other than the pixel reading (non-reading period), there are cases in which the drain wiring is brought into an "H" level and an "L" level. When the drain wiring is brought into an "L" level, there is a problem in that electrons leak from the drain wiring to the optoelectric transducer 101 via the resetting transistor 104 and the transfer transistor 102. Therefore, in the period other than the pixel reading, a driving method in which the drain wiring is brought into an "H" level is often adopted.

As described above, in a case where a driving method in which the drain wiring is brought into an "H" level in a period other than pixel reading is adopted, the timing relationship among the driving pulses, that is, a drain voltage DRN, a reset pulse RST, and a transfer pulse TRF, of the selection row in the pixel reading period, is shown in FIG. 17. In the timing chart of FIG. 17, a time t101 indicates a timing at which a reset level is received, and a time t102 indicates a timing at which a signal level is received.

In the non-selection row, the drain voltage DRN is provided in common, but the reset pulse RST and the transfer pulse TRF are not provided. The drain voltage DRN is usually placed at an "H" level (power-supply voltage). The electrical potential of the FD section 105 is at an "L" level for all the rows. When the reset pulse RST is provided to the selection row, the resetting transistor 104 is turned on, causing the electrical potential of the FD section 105 of the selection row to be placed at an "H" level. Consequently, the level when the selection row is reset, that is, the reset level, is output to the vertical signal line 107 through the amplifier transistor 103. This reset level is received at the circuit at the next stage.

Next, when the transfer pulse TRF is provided, the transfer transistor 102 is turned on, causing photoelectrons to be transferred from the optoelectric transducer 101 to the FD section 105 of the selection row. Then, the level of the FD section 105, which corresponds to the photoelectrons, that is, the signal level, is output to the vertical signal line 107 through the amplifier transistor 103. This signal level is received at the circuit at the next stage.

Thereafter, the drain wiring is placed at 0 V, and after the FD section 105 of the selection row is returned to the "L" level by providing the reset pulse RST, the drain wiring is returned to the "H" level (hereinafter referred to as a "backfilling operation"). A series of periods in which a pixel is made to operate in this manner is herein referred to as a reading period. In this reading period, by calculating the difference between the reset level and the signal level at the circuit at the next stage, a signal (pixel signal) corresponding to the amount of light photoreceived by the optoelectric transducer 101 can be obtained.

The inventors of the present invention test-produced a solid-state imaging device of the pixel configuration of FIG. 2. Then, the inventors discovered that, in this type of solid-state imaging device, a lot of pixels with more dark current appear on a captured image. Furthermore, by analyzing this phenomenon, the inventors clarified that a large part of the above phenomenon can be described as described below.

A bias current flows through the vertical signal line 107 in a particular period even other than the pixel reading period. FIG. 4 is an illustration thereof. In FIG. 4, the horizontal ineffective period is mainly a period in which the pixel is made to operate so that the signal is received at the circuit of the next stage. The horizontal effective period is mainly a period in which the pixel signals are output in sequence from the circuit of the next stage.

In order to read a pixel of a particular row, a bias current needs to be made to flow. In FIG. 4, the n-th row reading period is the above-described reading period for the n-th row. Periods A and B are periods in which a bias current flows in a state in which any row is not read before and after that reading period. After the pixel signal of the n-th row is read into the circuit at the next stage, the supply of the bias current is shut off. Thereafter, after passing through a horizontal effective period in which signals for one line are output in sequence from the circuit of the next stage, the reading of the next row is performed similarly.

Here, in the periods A and B, any row is not in a reading state. At this time, due to the relationship of variations of the threshold values of the amplifier transistor 103 and the resetting transistor 104, the bias current flows to a pixel having the lowest channel voltage of the amplifier transistor 103 (hereinafter referred to as a "low channel pixel") among a large number of pixels connected to the vertical signal line 107. In this connection, in the amplifier transistor 103 and the resetting transistor 104, since the threshold values are lowered to ensure an operation margin, a pixel for which electrical current cannot be shut off completely exists with respect to at least the variations.

An example of the distribution of low channel pixels of each column in the pixel section is shown in FIG. 18. In the periods A and B, electrical current flows through these low channel pixels. The potential of the amplifier transistor 103 of the pixel is shown in FIG. 19. The gate potential of the amplifier transistor 103 is at an "L" level. At this time, electrons flow into the drain wiring from the vertical signal line 107, and since the gate potential of the amplifier transistor 103 is at an "L" level, the potential difference at the drain end is large, and a high electric-field is applied.

When the electrons flow at this large potential difference, the electrons acquire large energy (these electrons are generally called "hot carriers"), part thereof is emitted to a P well, and photons are generated. The electrons and the photons jump into the optoelectric transducer 101 nearby, and dark current is formed. That is, the dark current of the pixel corresponding to FIG. 18 is large, and the dark current is displayed as a white point on the image-capturing plane. In practice, a column in which a plurality of white points appear and a column in which there is no conspicuous white point exist depending on the distribution of variations and the state of the interface.

Reading of pixels is performed on all the rows while being scanned in sequence for each row. In the periods A and B, the foregoing occurs in the low channel pixels of each column with respect to each of the rows. Consequently, the dark current of the low channel pixel becomes particularly large. That is, for the low channel pixel, since this phenomenon occurs when the pixel itself is not a selection row, the dark current becomes large. The white point which occurs due to the above reasons is hereinafter referred to as a "non-selection hot carrier white point").

In the pixel of the type in which the selection transistor is connected in series to the amplifier transistor 103, since the supply of the electrical current is completely shut off by that selection transistor also in the periods A and B, the problem of the non-selection hot carrier white point does not occur. In other words, the problem of the non-selection hot carrier white point is specific to the solid-state imaging device of the three-transistor-type pixel configuration having no selection transistor.

SUMMARY OF THE INVENTION

Accordingly, an object of the present invention is to provide a solid-state imaging device in which a non-selection hot carrier white point can be eliminated when a three-transistor-type pixel configuration having no selection transistor is adopted, a method of driving the solid-state imaging device, and a camera apparatus.

In a first aspect, the present invention provides a solid-state imaging device including: a pixel section formed in such a manner that a unit pixel having three transistors of a transfer transistor for transferring a signal of an optoelectric transducer to a floating diffusion section, an amplifier transistor for outputting a signal of the floating diffusion section to a signal line, and a resetting transistor for resetting the amplifier transistor and the floating diffusion section is arranged; and driving means for selecting each pixel of the pixel section by controlling the voltages of the drain and the gate of the resetting transistor and for causing a bias current supplied to the signal line to flow to a pixel associated with an immediately previous selection pixel during a non-reading period of pixels.

In a second aspect, the present invention provides a solid-state imaging device including: a pixel section formed in such a manner that a unit pixel having three transistors of a transfer transistor for transferring a signal of an optoelectric transducer to a floating diffusion section, an amplifier transistor for outputting a signal of the floating diffusion section to a signal line, and a resetting transistor for resetting the amplifier transistor and the floating diffusion section is arranged; driving means for selecting each pixel of the pixel section by controlling the voltages of the drain and the gate of the resetting transistor; and means for causing a bias current supplied to the signal line to flow to other than each pixel of the pixel section during the non-reading period of pixels.

In a third aspect, the present invention provides a solid-state imaging device including: a pixel section formed in such a manner that a unit pixel having three transistors of a transfer transistor for transferring a signal of an optoelectric transducer to a floating diffusion section, an amplifier transistor for outputting a signal of the floating diffusion section to a signal line, and a resetting transistor for resetting the amplifier transistor and the floating diffusion section is arranged; a bias current source for supplying a bias current to each pixel through the signal line; driving means for selecting each pixel of the pixel section by controlling the voltages of the drain and the gate of the resetting transistor; and means for shutting off the supply of the bias current to the signal line during the non-reading period of pixels.

In a fourth aspect, the present invention provides a solid-state imaging device including: a pixel section formed in such a manner that a unit pixel having three transistors of a transfer transistor for transferring a signal of an optoelectric transducer to a floating diffusion section, an amplifier transistor for outputting a signal of the floating diffusion section to a signal line, and a resetting transistor for resetting the amplifier transistor and the floating diffusion section is arranged; and driving means for selecting each pixel of the pixel section by controlling the voltages of the drain and the gate of the resetting transistor and for making the drain voltage of the resetting transistor to be an intermediate voltage between the power-supply voltage level and the ground level during the non-reading period of pixels.

In a fifth aspect, the present invention provides a solid-state imaging device including: a pixel section formed in such a manner that a unit pixel having three transistors of a transfer transistor for transferring a signal of an optoelectric transducer to a floating diffusion section, an amplifier transistor for outputting a signal of the floating diffusion section to a signal line, and a resetting transistor for resetting the amplifier transistor and the floating diffusion section is arranged; and driving means for selecting each pixel of the pixel section by controlling the voltages of the drain and the gate of the resetting transistor and for providing a resetting pulse whose voltage value on the high level side is higher than the voltage value of the power-supply voltage, to the gate of the resetting transistor.

In a sixth aspect, the present invention provides a solid-state imaging device including: a plurality of pixels arranged within an imaging area, wherein the pixels include an optoelectric transducer, an amplifier transistor, to whose gate a charge signal from the optoelectric transducer is supplied, and a resetting transistor for resetting the charge from the optoelectric transducer, in a reading period, after the gate potential of the amplifier transistor is changed to a predetermined level, the amplifier transistor amplifies and outputs the charge signal from the optoelectric transducer, and in the reading period and in the non-reading period immediately thereafter, the gate of the amplifier transistor is not subjected to electrical potential adjustment.

In a seventh aspect, the present invention provides a solid-state imaging device including: a plurality of pixels arranged within an imaging area; a signal line for guiding a signal from the pixel to outside the imaging area; an electrical current source for supplying a bias current to the signal line; and switching means for changing the flow of the bias current. The solid-state imaging device according to each aspect of the-present invention is used as an image-capturing device in a camera apparatus (image-capturing apparatus).

DESCRIPTION OF THE PREFERRED EMBODIMENTS

Embodiments of the present invention will now be described below in detail with reference to the drawings.

Figure 1:
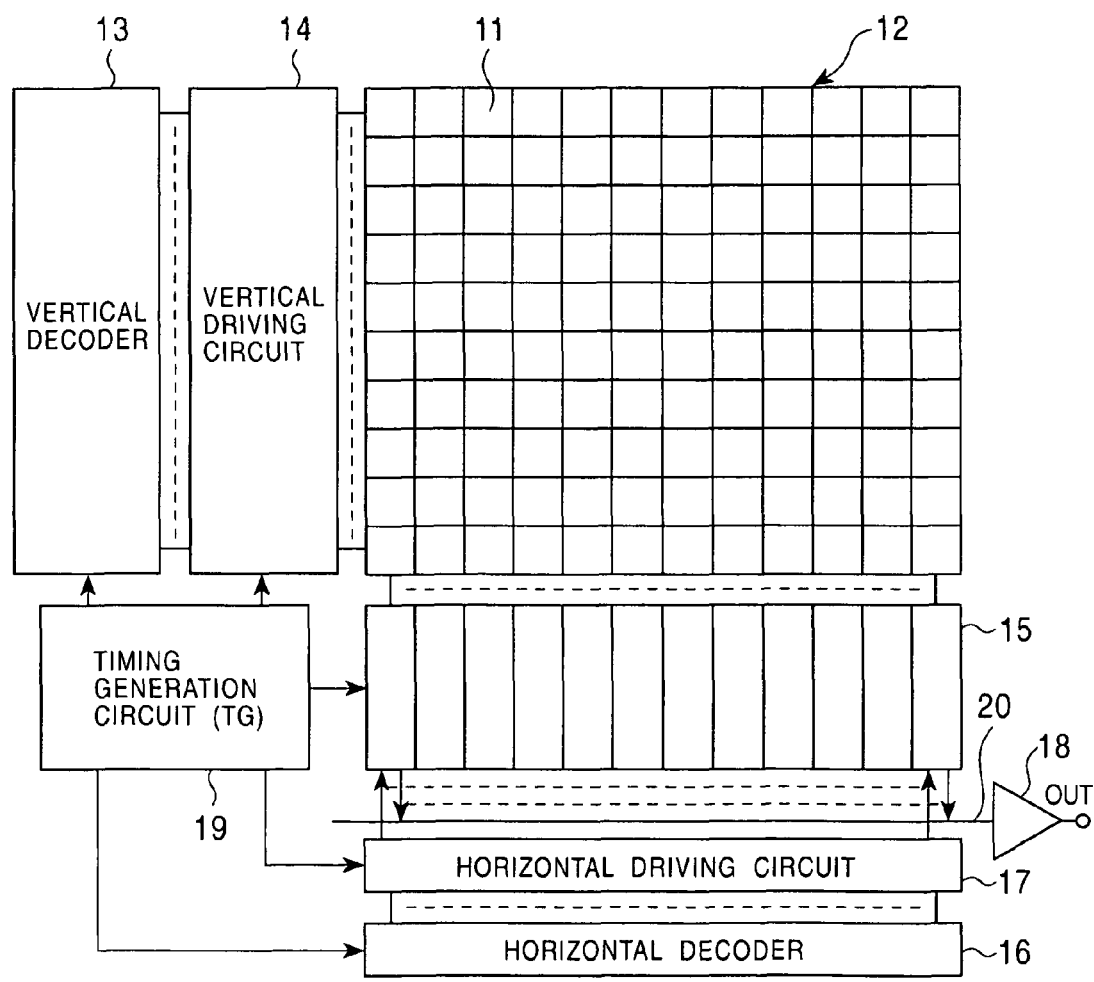
FIG. 1 is a block diagram showing the overview of the configuration of an X-Y address type solid-state imaging device.

FIG. 1 is a block diagram showing the overview of the configuration of an X-Y address type solid-state imaging device typified by a MOS-type solid-state imaging device. As can be seen from FIG. 1, the X-Y address type solid-state imaging device is configured in such a manner that, around a pixel section 12 in which a large number of unit pixels 11 are arranged two-dimensionally in a matrix, a vertical decoder 13, a vertical driving circuit 14, a column circuit 15, a horizontal decoder 16, a horizontal driving circuit 17, an output circuit 18, and a timing generation circuit (TG) 19 are arranged.

The vertical decoder 13 selects each pixel 11 of the pixel section 12 in units of rows by scanning in a vertical direction (in a column direction), and also selects the row for electronic shutter. The vertical driving circuit 14 drives each pixel 11 of the row selected by the vertical decoder 13. The column circuit 15, which is provided in such a manner as to correspond to each vertical pixel column of the pixel section 12, receives the reset level and the signal level from each pixel 11 of the row selected by the vertical decoder 13, and calculates the difference between these levels, thereby obtaining a pixel signal for one line, and performs various kinds of signal processing, such as a process for removing fixed pattern noise of the pixel 11, and AD conversion.

The horizontal decoder 16 selects each of the column circuits 15 in sequence by scanning in a horizontal direction (in a row direction). The horizontal driving circuit 17 reads a pixel signal for one line, which is obtained at each of the column circuits 15, into a horizontal signal line 20 from the column circuit 15 selected in sequence by the horizontal decoder 16. The output circuit 18 outputs the pixel signals for one line in the sequence in which these are read out to the horizontal signal line 20. In this output circuit 18, AD conversion can also be performed, and furthermore, there are cases in which various kinds of signal processing, such as a signal amplification process, a color-signal-related process, and a signal compression process, are performed.

The timing generation circuit 19 generates a driving pulse required for the operation of each section, such as the vertical decoder 13, the vertical driving circuit 14, the column circuit 15, the horizontal decoder 16, and the horizontal driving circuit 17, and also generates various kinds of driving pulses (the drain voltage DRN, the reset pulse RST, the transfer pulse TRF, etc.) (to be described later) used when each pixel 11 of the pixel section 12 is driven. That is, the timing generation circuit 19 functions as a driving means for driving each pixel 11 of the pixel section 12.

Figure 2:
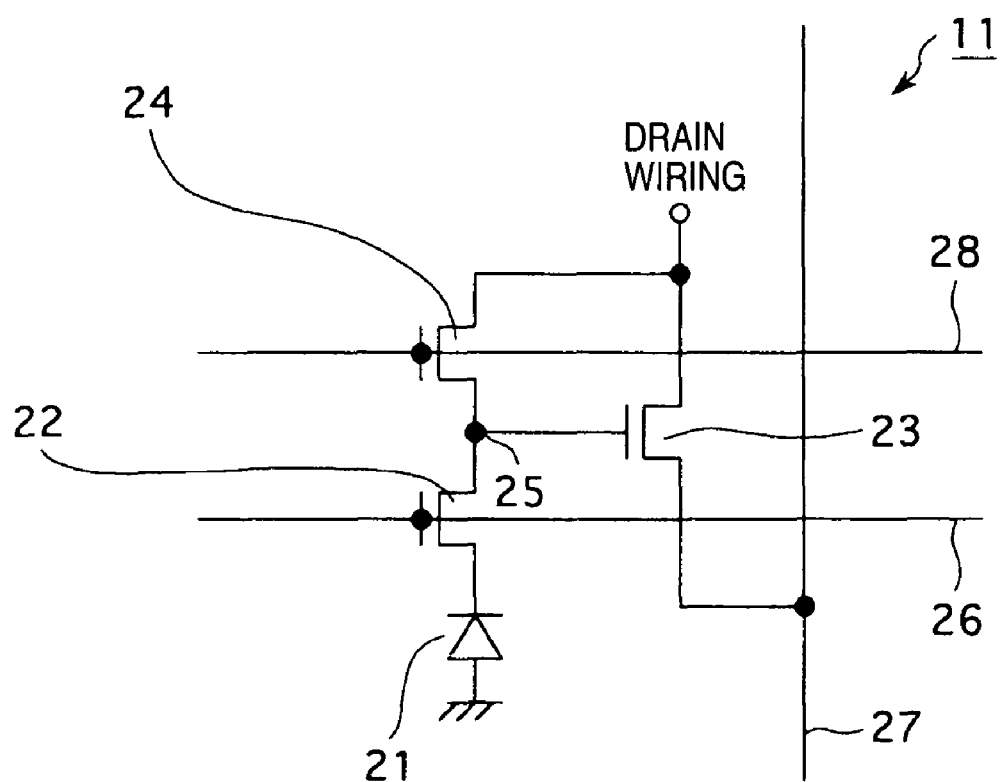
FIG. 2 is a circuit diagram showing an example of a pixel circuit of a unit pixel.

FIG. 2 is a circuit diagram showing an example of a pixel circuit of the unit pixel 11. As can be seen from FIG. 2, the unit pixel 11 according to this example has a three-transistor pixel configuration having an optoelectric transducer (here, photodiode) 21, a transfer transistor 22, an amplifier transistor 23, and a resetting transistor 24. The transfer transistor 22, the amplifier transistor 23, and the resetting transistor 24 are each formed by a MOS transistor. As the resetting transistor 24, a depletion-type transistor is used.

In this pixel circuit, the source of the transfer transistor 22 is connected to the cathode of the optoelectric transducer 21, the drain thereof is connected to an FD section 25, and the gate thereof is connected to transfer wiring 26. The transfer transistor 22 transfers the photoelectrons obtained by performing optoelectric conversion at the optoelectric transducer 21 to the FD section 25. Here, the FD section 25 is a diffusion layer having a parasitic capacitance. The gate of the amplifier transistor 23 is connected to the FD section 25, the drain thereof is connected to drain wiring (not shown), and the source thereof is connected to the vertical signal line 27, so that a signal corresponding to the electrical potential of the FD section 25 (a reset level/a signal level) is output to the vertical signal line 27. The source of the resetting transistor 24 is connected to the FD section 25, the drain thereof is connected to the drain wiring in common with the drain of the amplifier transistor 23, and the gate thereof is connected to resetting wiring 28, so that the electrical potential of the FD section 25 is controlled.

The drain wiring to which the drain of the amplifier transistor 23 and the drain of the resetting transistor 24 are connected in common is commonly wired to most of the pixels 11 of the pixel section 12. Then, the drain wiring extends in the column direction (in the vertical direction) and is common at the end of the pixel section 12, or the drain wiring is wiring in a lattice form in which an opening is provided in the optoelectric transducer 21. There may be some pixels, such as dummy pixels, in which the drain wiring is separate from that of the effective pixels (pixels used for taking a picture). The drain voltage DRN is supplied to the drain wiring, the transfer pulse TRF is supplied to the transfer wiring 26, and the reset pulse RST is supplied to the resetting wiring 28.

In the MOS-type solid-state imaging device in which the above-described pixels 11 of the three-transistor configuration are arranged two-dimensionally in a matrix and each pixel 11 is selected by controlling the voltages of the drain and the gate of the resetting transistor 24, in order to solve the problem of a non-selection hot carrier white point specific to a three-transistor type, driving methods according to each of the embodiments described below are adopted. The driving methods according to each embodiment are realized under the timing control by the timing generation circuit 19 that functions as a driving means for driving each pixel 11 of the pixel section 12. The driving methods according to each embodiment will be described below specifically.

First Embodiment

Figure 3:
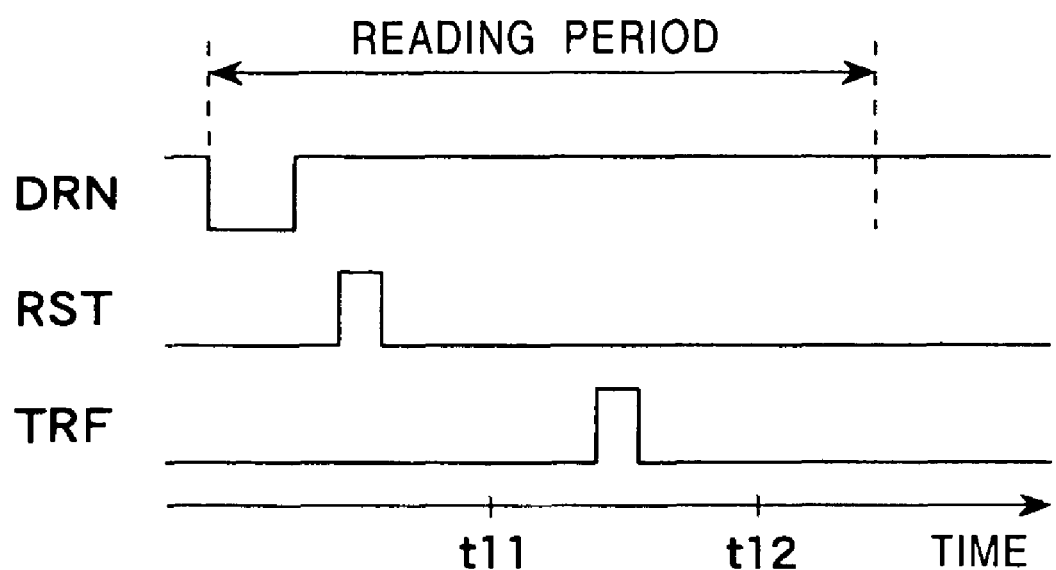
FIG. 3 is a timing chart illustrating a method of driving a solid-state imaging device according to a first embodiment of the present invention.

The feature of a first embodiment of the present invention is a method of driving the solid-state imaging device in the configuration of FIG. 1. FIG. 3 is a timing chart illustrating a method of driving the solid-state imaging device according to the first embodiment of the present invention. FIG. 3 also shows a timing relationship among the driving pulses, that is, the drain voltage DRN, the reset pulse RST, and the transfer pulse TRF, of a selection row (assumed to be an n-th row) during a pixel reading period. In the timing chart of FIG. 3, a time t11 indicates a timing at which a reset level is received, and a time t12 indicates a timing at which a signal level is received.

In the non-selection row, the drain voltage DRN is supplied in common, but the reset pulse RST and the transfer pulse TRF are not supplied. Usually, if a pulse of a negative polarity ("L" level) is supplied to the drain wiring at an "H" level, the FD sections 25 of all the rows are reset to an "L" level. That is, the FD sections 25 of all the rows are backfilled. Here, the "L" level of the FD section 25 is determined by the threshold value of the resetting transistor 24, and is not necessarily 0 V. When the resetting transistor 24 is of a depletion type, the "L" level is an electrical potential of 0.5 V, etc.

Next, when the reset pulse RST is supplied to the selection row, the resetting transistor 24 is turned on, causing the FD section 25 of the selection row to be placed at an "H" level. As a result, the level when the selection row is reset, that is, the reset level, is output to the vertical signal line 27 through the amplifier transistor 23. Here, the "H" level of the FD section 25 is not a power-supply voltage, and becomes an electrical potential lower than that, for example, a power-supply voltage of −0.5 V, due to an influence such as a threshold offset. This reset level is received at the column circuit 15 at the timing of time t11.

Next, when the transfer pulse TRF is supplied to the selection row, the transfer transistor 22 is turned on, causing photoelectrons to be transferred from the optoelectric transducer 21 to the FD section 25 of the selection row. Then, the level of the FD section 25 corresponding to the photoelectrons, that is, the signal level, is output to the vertical signal line 27 through the amplifier transistor 23. This signal level is received at the column circuit 15 at the timing of time t12.

Figure 4:
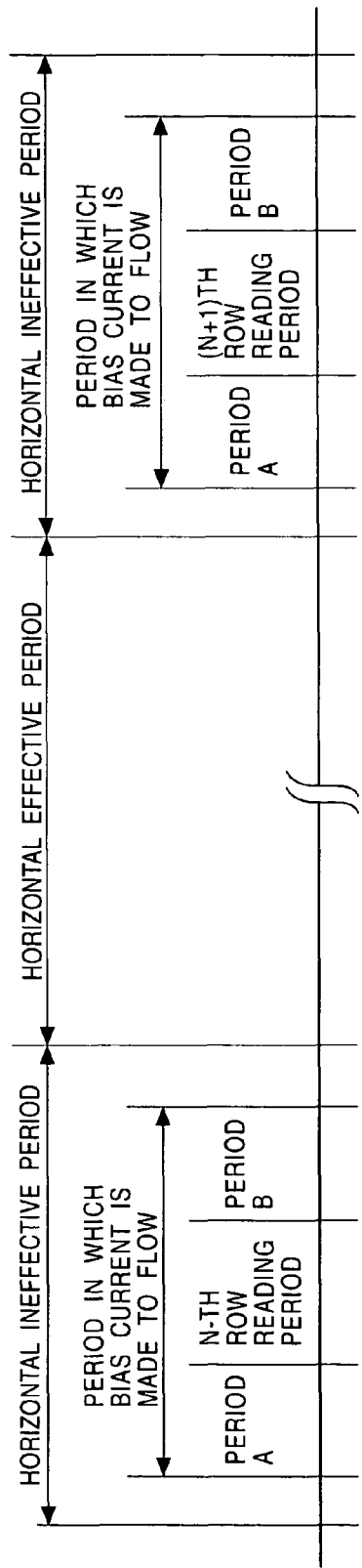
FIG. 4 is an illustration of the operation of the solid-state imaging device.

The column circuit 15 calculates the difference between the reset level and the signal level, which are received at each timing of times t11 and t12, and holds, with respect to the pixels for one line, the difference as an actual signal level in which the noise components are removed, that is, the input signal level. Thereafter, as shown in FIG. 4, the driving of the next row is performed after passing through a period B and a horizontal effective period in which the signals held in the vertical driving circuit 14 of each column are output in sequence through the horizontal signal line 20.

Here, the difference of the first embodiment from the above-described conventional technology is that the backfilling operation is performed just before the reading. Therefore, after the pixels are read, the FD section 25 of the n-th row is not backfilled in the period B, the horizontal effective period, and the period A of the next row. Therefore, in the periods A and B, the bias current flows to the n-th row as is. In the method of driving a three-transistor pixel according to a conventional example, since the bias current always flows to the low channel pixel, which is determined for each column, when there are, for example, 1,000 rows in the pixel section 12, dark current for 1,000 pixels is generated at the low channel pixels of each column.

Figure 5:
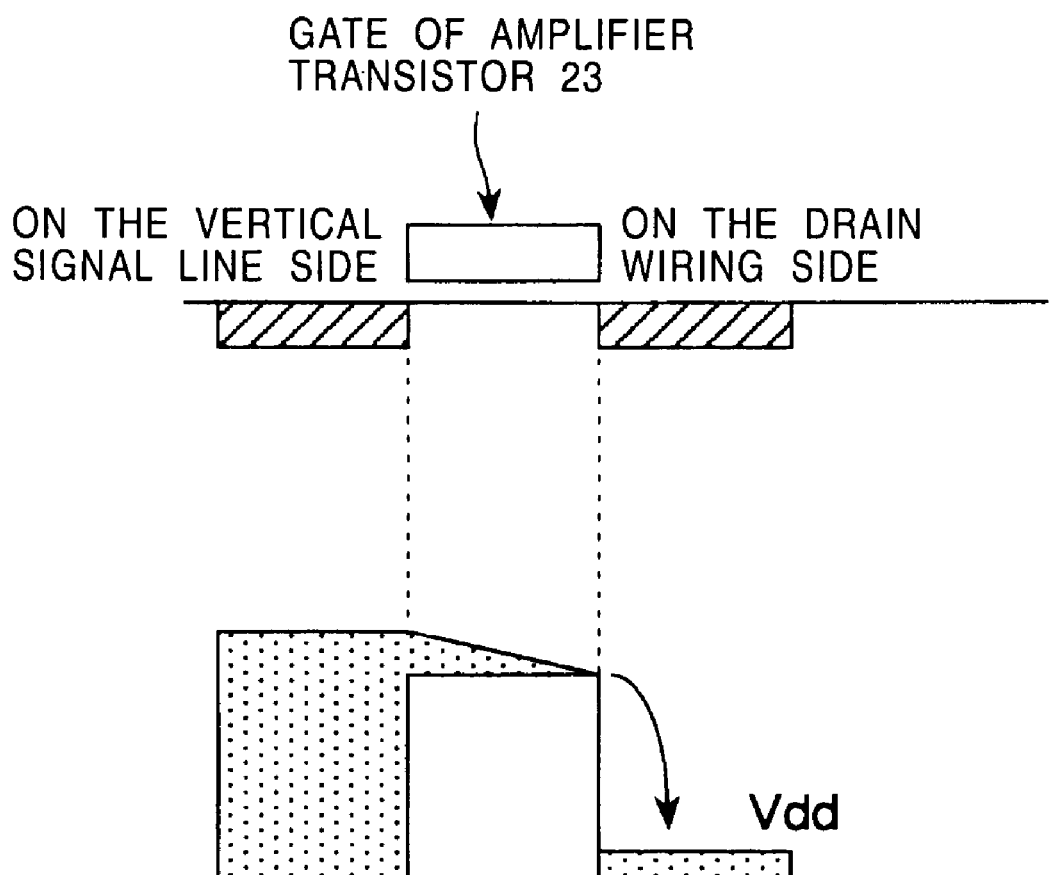
FIG. 5 is a potential diagram of an amplifier transistor when a method of driving the solid-state imaging device according to the first embodiment is adopted.

In comparison, in the method of driving a solid-state imaging device according to this embodiment, dark current for one line for one pixel (in practice, for one pixel because of being in units of columns) is brought about for each pixel when the pixel itself is selected. The potential of the amplifier transistor 23 of the n-th row in the case of the method of driving the solid-state imaging device according to this embodiment is shown in FIG. 5. As can be seen from FIG. 5, since the FD section 25 is not backfilled, the gate potential of the amplifier transistor 23 is not at an "L" level. Therefore, the potential difference when the electrons of the bias current flow to the drain wiring is smaller than that in the case of the conventional technology. Therefore, hot carriers are not likely to occur. Since the probability of the occurrence of the hot carrier increases with the exponential function of this potential difference, the dark current which causes hot carriers to occur is decreased markedly because the potential difference is small.

As described above, in the solid-state imaging device according to the first embodiment, as a result of causing the bias current supplied to the vertical signal line 27 to flow to a pixel associated with the immediately previous selection pixel, for example, the immediately previous selection pixel itself, during the non-reading period of pixels, dark current for one line (for one pixel) is brought about for each pixel when the pixel itself is selected, and the dark current itself for one line can be decreased markedly. Therefore, it is possible to virtually eliminate defective pixels due to non-selection hot carrier white points.

Figure 6:
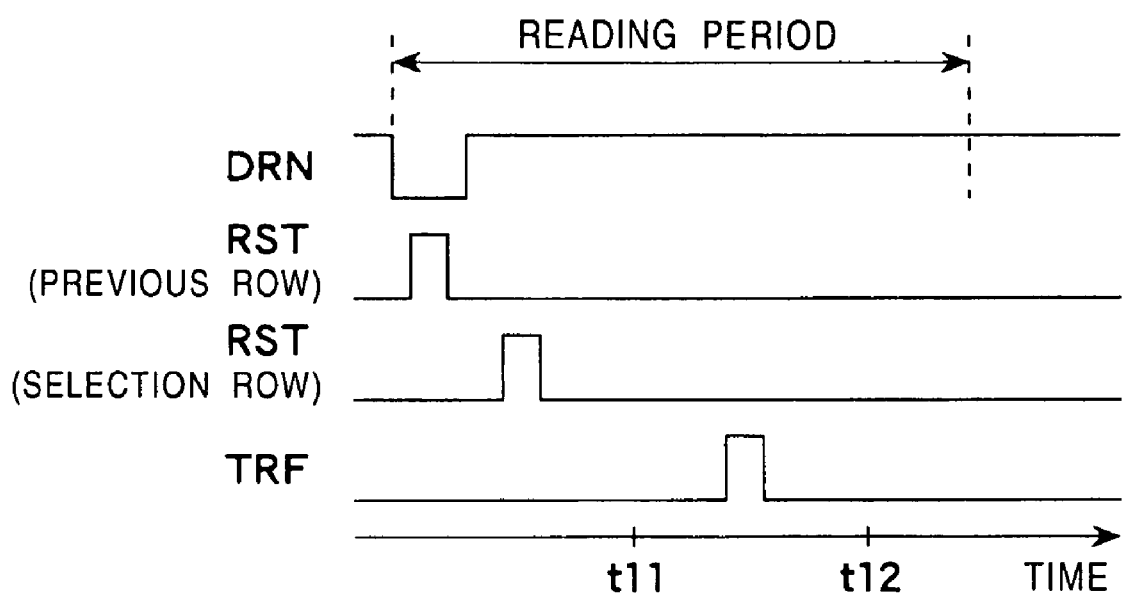
FIG. 6 is a timing chart when a depletion-type transistor is not used as a resetting transistor.

In this embodiment, as a preferred example, a depletion-type transistor is used as the resetting transistor 24. However, when a depletion-type transistor is not used, as shown in FIG. 6, the fact that the reset pulse RST needs only to be supplied to at least the previous row during the period in which the drain voltage DRN at an "L" level is supplied can be easily understood by a person skilled in the art.

Furthermore, if the reset pulse RST is supplied again to the selection row immediately after the reading of the signal level, the level of the FD section 25 of the selection row always becomes an "H" level regardless of the amount of incidence light and becomes almost constant regardless of the pixel, which is desirable. Furthermore, it is clear that, after the reception of the signal level, even if the selection row is backfilled, instead, the FD section 25 may be placed at an "H" level by providing the reset pulse RST to another row (for example, the next row) associated with the selection row, causing a bias current to flow to the other row.

Figure 7:
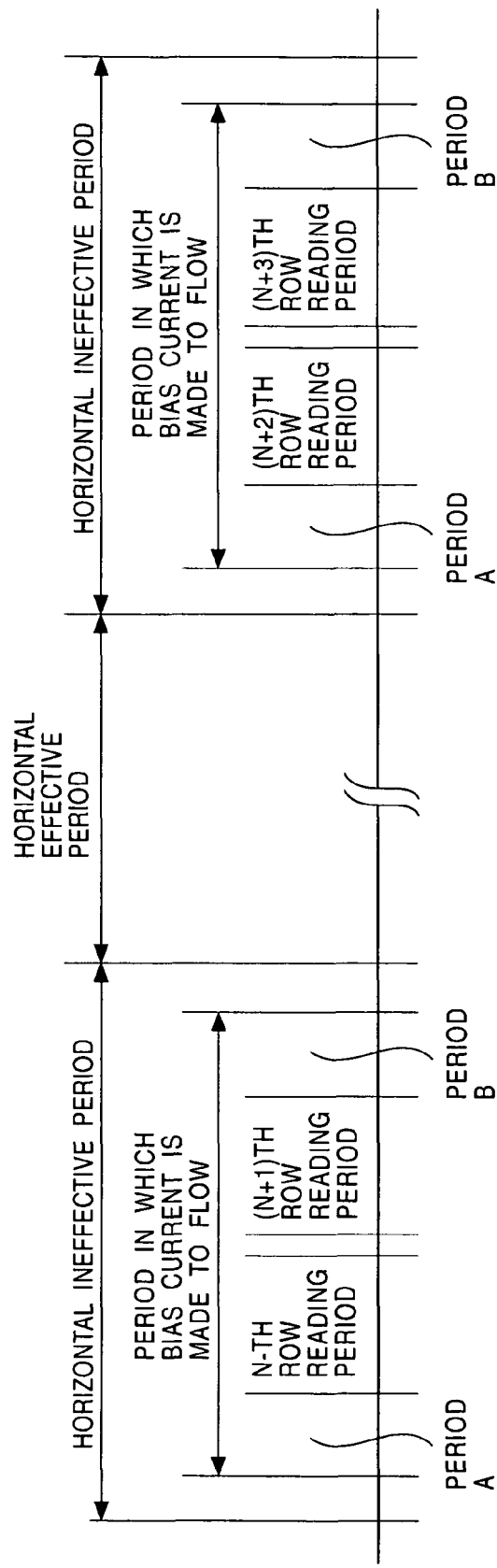
FIG. 7 is an illustration of the operation performed when two rows are read during one horizontal ineffective period.

Furthermore, there is a plural row reading configuration in which signals of a plurality of rows are collectively read. In that case, for example, as shown in FIG. 7, the reading is performed in the sequence of the n-th row and the (n+1)th row. Here, the reading of the n-th row is in the sequence of "backfilling→reading", and also, the reading of the (n+1)th row is in the sequence of "backfilling→reading". Therefore, thereafter, in the periods B and A before the reading of the (n+2)th row, electrical current flows to the (n+1)th row, and similarly to the foregoing, the dark current which causes hot carriers to occur does not become a problem.

In the manner described above, the application to the configuration of reading a plurality of rows can be easily understood from the description up to this point by a person skilled in the art. The same applies to the electronic shutter operation. There are various variations for the method of implementation including the electronic shutter, and these are also obvious to a person skilled in the art.

Second Embodiment

Figure 8:
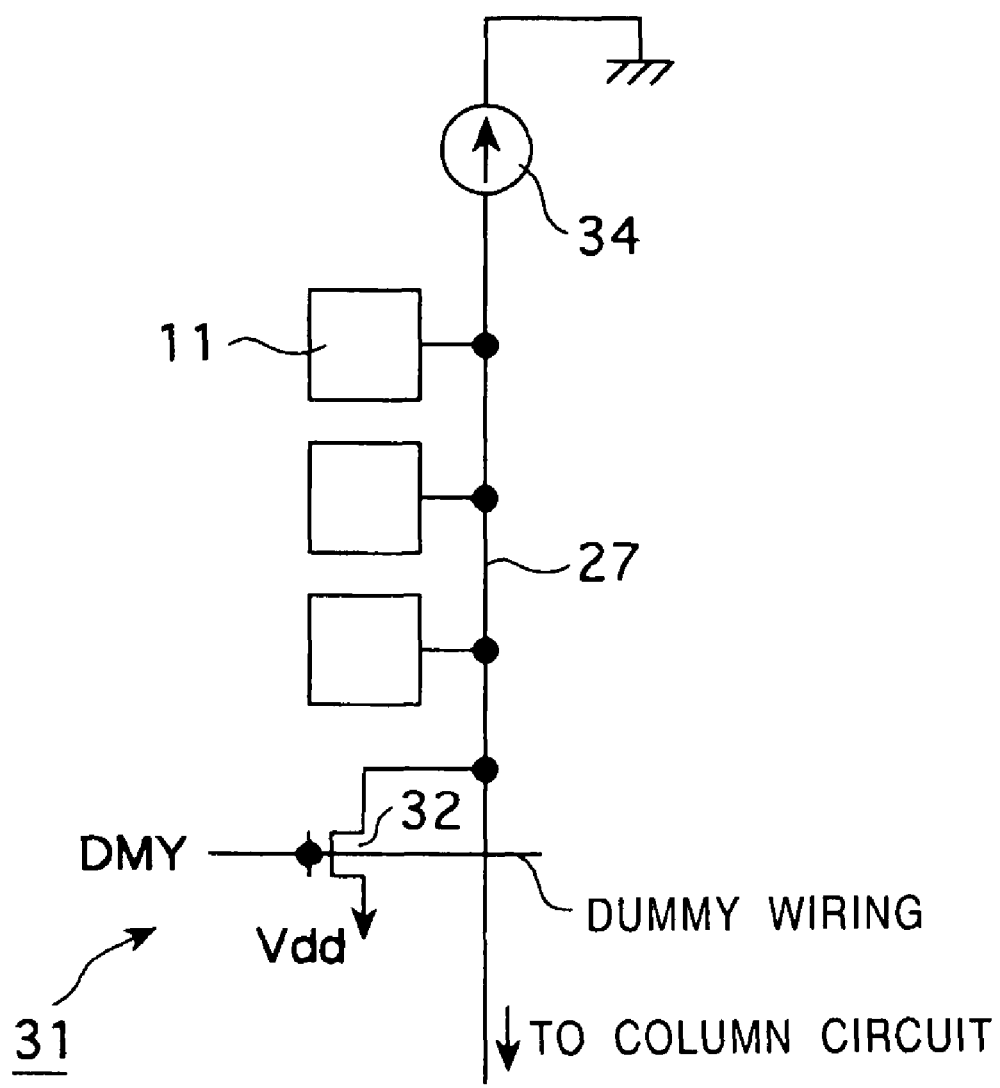
FIG. 8 is a block diagram showing the configuration of the main part of a solid-state imaging device according to a second embodiment of the present invention.

FIG. 8 is a block diagram showing the configuration of the main part of a solid-state imaging device according to a second embodiment of the present invention. In the solid-state imaging device of this embodiment, in an area other than the effective pixel (pixel used to take a picture) area of the pixel section 12, a means for causing a bias current supplied to the vertical signal line 27 to flow to other than each pixel 11 of the pixel section 12 during the non-reading period of pixels, for example, a dummy pixel (dummy row for one line) 31 added to each of the vertical signal lines 27, is provided.

In FIG. 8, the dummy pixel 31 is formed by a single MOS transistor 32. The source of the MOS transistor 32 is connected to the vertical signal line 27, the gate thereof is connected to dummy wiring 33, and the drain thereof is connected to a power supply Vdd. In the solid-state imaging device according to the second embodiment in which the dummy pixel 31 is connected to each of the vertical signal lines 27 in this manner, the driving is performed in the following manner.

Figure 9:
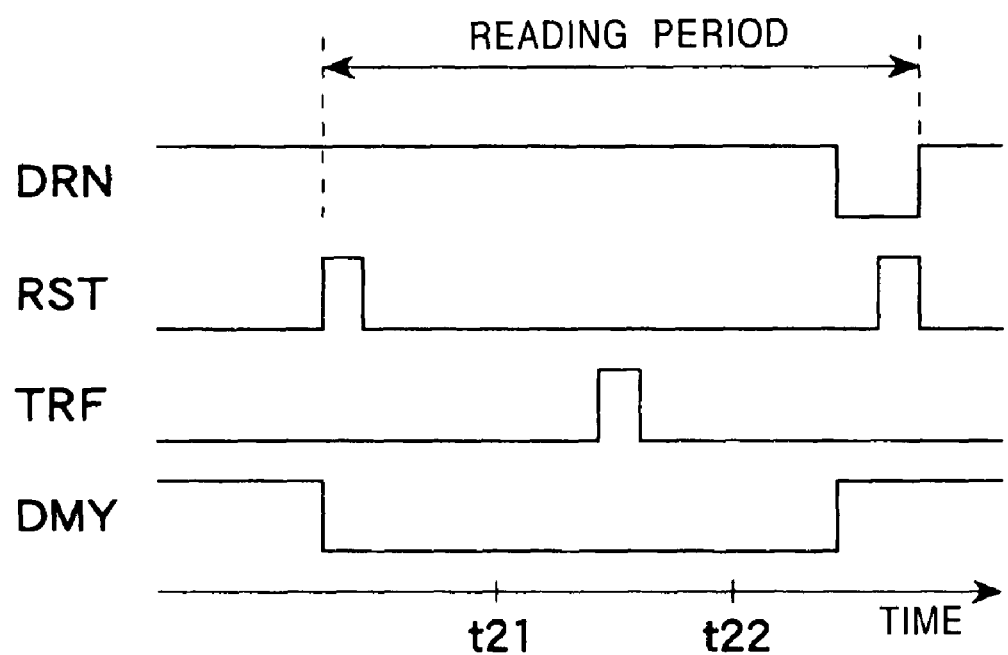
FIG. 9 is a timing chart illustrating a method of driving the solid-state imaging device according to the second embodiment of the present invention.

FIG. 9 is a timing chart illustrating a method of driving the solid-state imaging device according to the second embodiment of the present invention. FIG. 9 also shows a timing relationship among the driving pulses, that is, the drain voltage DRN, the reset pulse RST, the transfer pulse TRF, and a dummy pulse DMY, of a selection row (assumed to be an n-th row) during a pixel reading period. Here, the dummy pulse DMY is a driving pulse provided to the dummy pixel 31, that is, the gate of the MOS transistor 32, via the dummy wiring 33.

Figure 17:
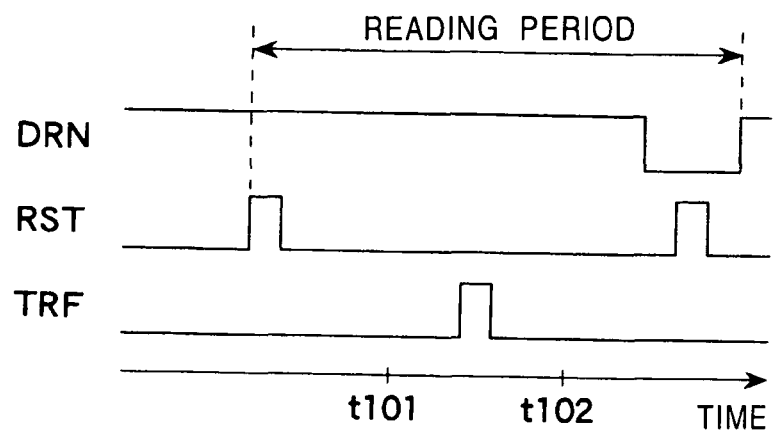
FIG. 17 is a timing chart showing a driving timing according to a conventional example.
Figure 18:
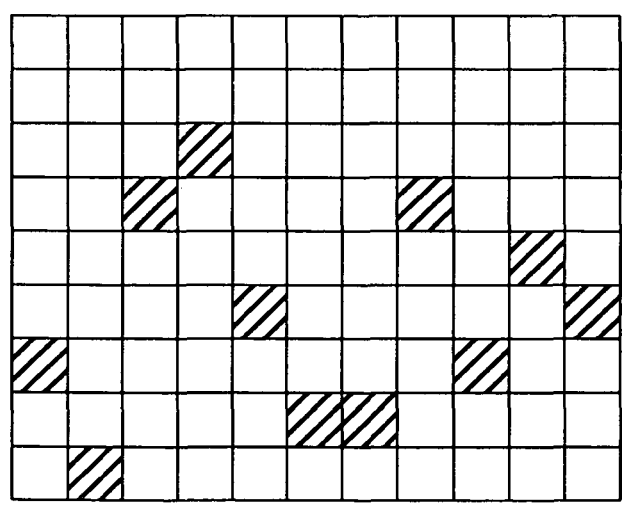
FIG. 18 shows an example of the distribution of low channel pixels.
Figure 19:
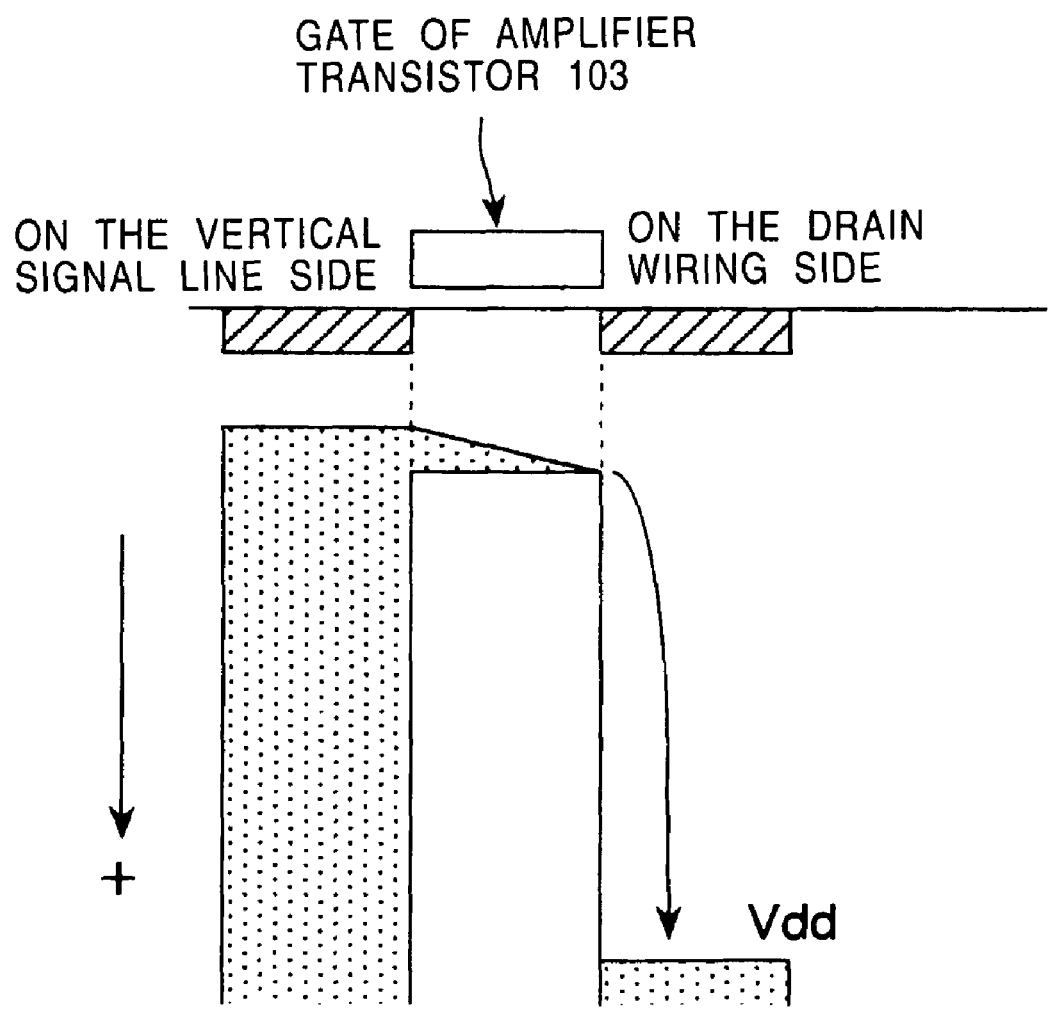
FIG. 19 is a potential diagram of an amplifier transistor when a method of driving a solid-state imaging device according to a conventional example is adopted.

In the timing chart of FIG. 9, the timing relationship among the drain voltage DRN, the reset pulse RST, and the transfer pulse TRF is basically the same as that of the case according to the conventional technology (see FIG. 17). A time t21 indicates a timing at which a reset level is received, and a time t22 indicates a timing at which a signal level is received. The second embodiment differs from the case of the conventional technology in that, in the period other than the reading period of the selection row, the dummy pixel 31 is turned on, and a bias current is made to flow to the dummy pixel 31.

More specifically, in the reading period of the selection row, whereas the MOS transistor 32 of the dummy pixel 31 is turned off by causing the dummy pulse DMY to be placed at an "L" level, in the period other than the reading period of the selection row (the non-reading period), the MOS transistor 32 is turned on by causing the dummy pulse DMY to be placed at an "H" level. As a result of the MOS transistor 32 becoming on, in the non-reading period, the bias current which is supplied from a bias-current source 34 is made to flow to the power supply Vdd through the dummy pixel 31.

As described above, in the solid-state imaging device according to the second embodiment, a means for causing the bias current supplied to the vertical signal line 27 to flow to other than each pixel 11 of the pixel section 12 during the non-reading period of pixels, for example, the dummy pixel 31 added to each of the vertical signal lines 27, is provided in an area other than the effective pixel area of the pixel section 12. As a result, the bias current does not flow to each pixel 11 of the pixel section 12, in particular, the low channel pixels, and the occurrence of the non-selection hot carrier white points is concentrated on the dummy pixel 31. Therefore, defective pixels due to non-selection hot carrier white points for the effective pixels can be virtually eliminated.

In this embodiment, the dummy pixel 31 is formed by a single MOS transistor 32. Alternatively, the dummy pixel 31 may be configured the same as the pixel 11 of the effective pixel area, that is, formed to be a three-transistor pixel configuration, so that, when reading is not performed in any row, the dummy pixel is selected, and the bias current is made to flow thereto. Thus, it is possible to virtually eliminate defective pixels due to non-selection hot carrier white points.

As a result of configuring the dummy pixel 31 the same as the pixel 11 of the effective pixel area, there is the advantage in that the dummy pixel 31 can be produced by the same process as that for the pixel 11. However, configuring the dummy pixel 31 by a single MOS transistor makes it possible to form the dummy pixel 31 very finely. Therefore, when compared to the case in which the dummy pixel 31 is configured to be the same as the pixel 11, there is the advantage in that defective pixels due to non-selection hot carrier white points can be eliminated without expanding the area of the pixel section 12.

Third Embodiment

Figure 10:
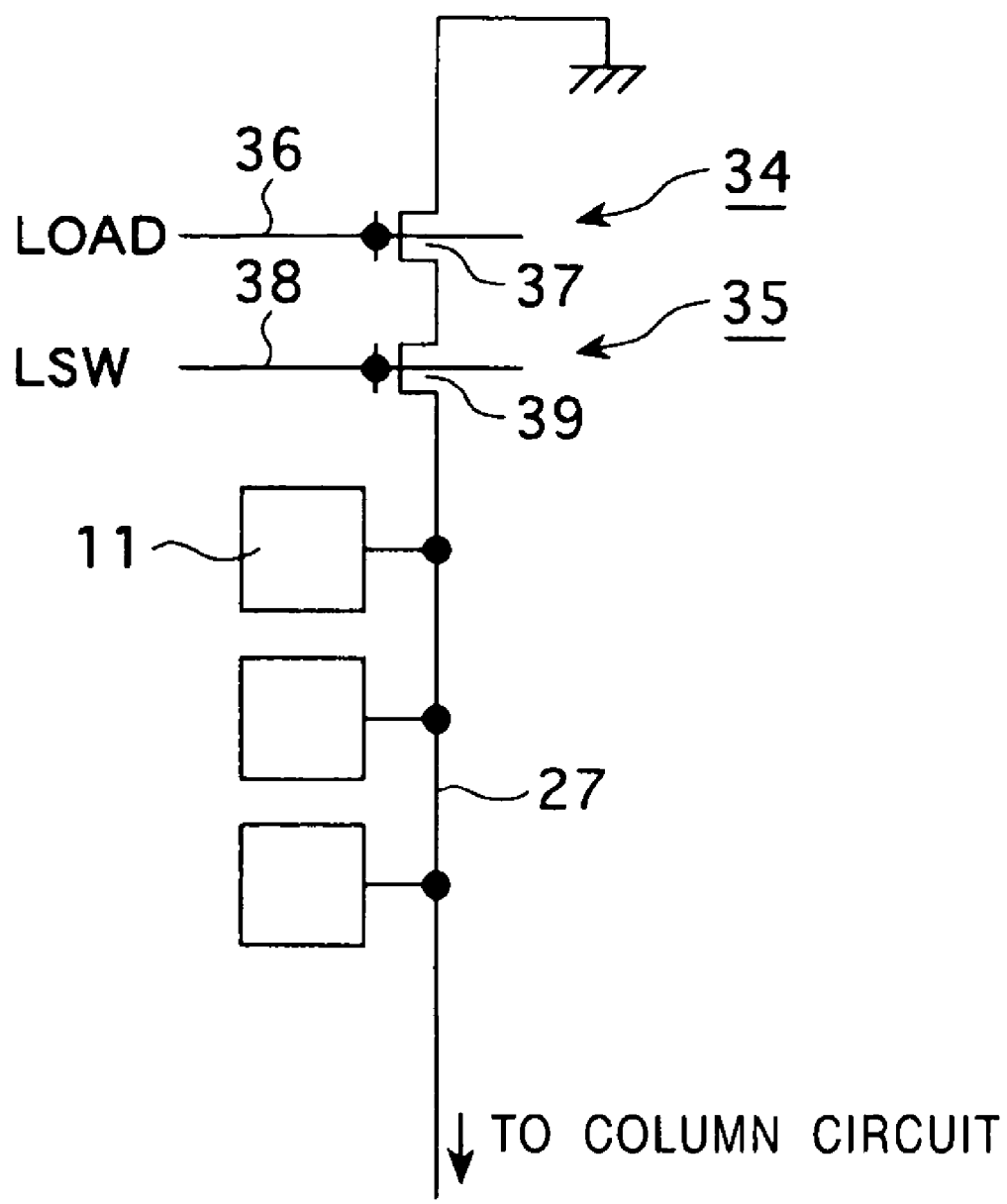
FIG. 10 is a block diagram showing the configuration of the main part of a solid-state imaging device according to a third embodiment of the present invention.

FIG. 10 is a block diagram showing the configuration of the main part of a solid-state imaging device according to a third embodiment of the present invention. In the solid-state imaging device according to this embodiment, a means for shutting off the supply of the bias current during a non-reading period of pixels, for example, a switching element 35, is provided in series to the bias-current source 34.

In FIG. 10, the bias-current source 34 (the same as the bias-current source 34 of FIG. 8) is formed by a load MOS transistor 37 whose source is grounded and whose gate is connected to load wiring 36. The load MOS transistor 37 determines the current value of the bias current which is made to flow to the vertical signal line 27 as a result of a voltage of approximately 1 V being supplied through the load wiring 36.

The switching element 35 for shutting off the supply of the bias current is formed by a MOS transistor 39, for example, whose source is connected to the drain of the load MOS transistor 37, whose drain is connected to the vertical signal line 27, and whose gate is connected to switching wiring 38, the switching element 35 being connected in series to the bias-current source 34. The channel width W of the MOS transistor 39 is set in such a degree so as to be satisfactorily capable of performing a switching operation as a result of the gate potential swinging between 0 V and the power-supply voltage.

Figure 11:
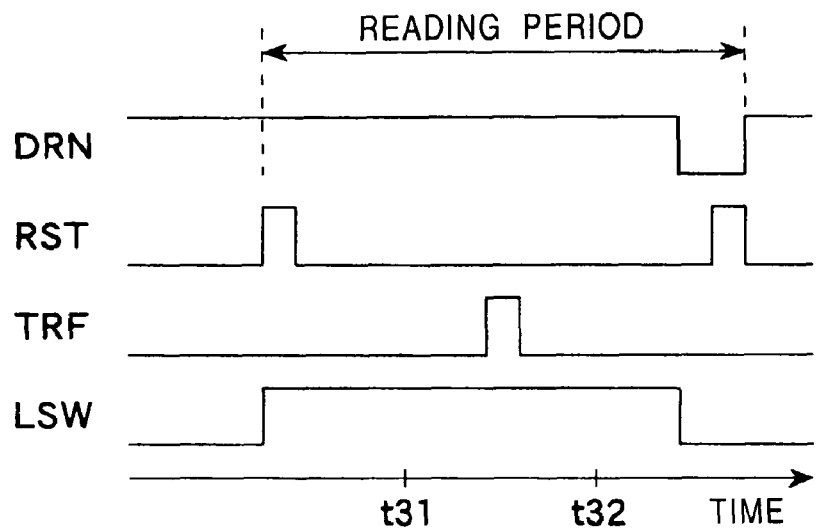
FIG. 11 is a timing chart illustrating a method of driving the solid-state imaging device according to the third embodiment of the present invention.

FIG. 11 is a timing chart illustrating a method of driving the solid-state imaging device according to the third embodiment. FIG. 11 also shows a timing relationship among the driving pulses, that is, the drain voltage DRN, the reset pulse RST, the transfer pulse TRF, and a switching pulse LSW, of a selection row (assumed to be an n-th row) during a pixel reading period. Here, the switching pulse LSW is a driving pulse provided to the switching element 35, that is, the gate of the MOS transistor 39, through the switching wiring 38.

In the timing chart of FIG. 11, the timing relationship among the drain voltage DRN, the reset pulse RST, and the transfer pulse TRF is basically the same as the case according to the conventional technology (see FIG. 17). A time t31 indicates a timing at which a reset level is received, and a time t32 indicates a timing at which a signal level is received. The switching element 35 is turned on (closed) only during the reading period of the selection row in order to cause a bias current to be supplied to the vertical signal line 27, and in the period other than the reading period of the selection row (non-reading period), the switching element 35 is turned off (open) to shut off the supply of the bias current. As a result, the periods A and B in FIG. 4 are eliminated or made sufficiently short.

As described above, in the solid-state imaging device according to the third embodiment, a means for shutting off the supply of the bias current to the vertical signal line 27 during the non-reading period of pixels is provided to cut the bias current before and after the reading. As a result, since the bias current, which causes a non-selection hot carrier white point to occur, does not flow to the low channel pixel, defective pixels due to non-selection hot carrier white points can be virtually eliminated.

In this embodiment, as the means for shutting off the supply of the bias current, the MOS transistor 39 connected between the load MOS transistor 37 and the vertical signal line 27 is used. In addition, the load MOS transistor 37 itself can also be used as that means. That is, the supply of the bias current can be shut off by causing the gate voltage of the load MOS transistor 37 to become 0 V and causing the load MOS transistor 37 to be turned off during the non-reading period of pixels. As a result of also using the load MOS transistor 37 as a means for shutting off the supply of the bias current, there is the advantage in that the number of elements can be reduced when compared to the case in which that means is provided in a dedicated manner. However, when this technique is adopted, an operation speed of such a degree as to be capable of ensuring the time required for the bias current to be stabilized when the supply of the bias current is started is required.

Fourth Embodiment

Figure 12:
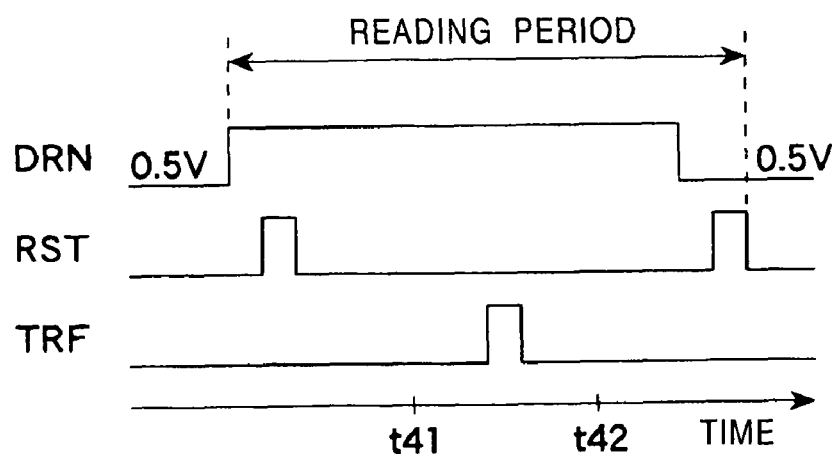
FIG. 12 is a timing chart illustrating a method of driving a solid-state imaging device according to a fourth embodiment of the present invention.

The feature of a fourth embodiment of the present invention is a method of driving the solid-state imaging device in the pixel configuration of FIG. 2. FIG. 12 is a timing chart illustrating the method of driving the solid-state imaging device according to the fourth embodiment. FIG. 12 also shows a timing relationship among the driving pulses, that is, the drain voltage DRN, the reset pulse RST, and the transfer pulse TRF, of a selection row (assumed to be an n-th row) during a pixel reading period. In the timing chart of FIG. 12, a time t41 indicates a timing at which a reset level is received, and a time t42 indicates a timing at which a signal level is received.

As can be seen from the timing chart of FIG. 12, in the method of driving the solid-state imaging device according to this embodiment, the drain voltage DRN of the resetting transistor 24 is placed at an "H" level (=the power-supply voltage) only in the reading period, and for the period other than that, the drain voltage is placed at an intermediate voltage (a voltage between the power-supply voltage level and the ground level), which is close to 0 V. The reason why the drain voltage DRN is placed at an intermediate voltage is for the purpose of preventing electrons to leak from the drain wiring to the optoelectric transducer 21. Furthermore, as an intermediate voltage close to 0 V, a voltage value of approximately 0.2 to 0.7 V is preferable. At this time, in both periods A and B of FIG. 4, the drain voltage DRN is not at an "H" level, or since the time of the "H" level is sufficiently short, the occurrence of hot carriers is suppressed, and the dark current becomes sufficiently small.

As described above, in the solid-state imaging device according to the fourth embodiment, as a result of causing the drain voltage DRN of the resetting transistor 24 to be an intermediate voltage, preferably, 0.2 to 0.7 V, during the non-reading period of pixels, the occurrence of hot carriers can be suppressed, and the dark current can be reduced sufficiently. Therefore, defective pixels due to non-selection hot carrier white points can be virtually eliminated.

Fifth Embodiment

Figure 13:
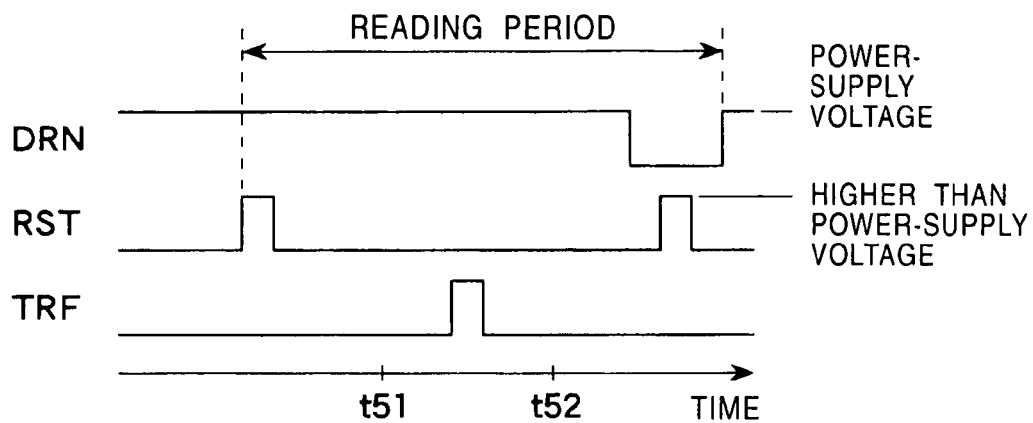
FIG. 13 is a timing chart illustrating a method of driving a solid-state imaging device according to a fifth embodiment of the present invention.

In a fifth embodiment of the present invention, the feature is a method of driving a solid-state imaging device in the pixel configuration of FIG. 2. FIG. 13 is a timing chart illustrating a method of driving the solid-state imaging device according to the fifth embodiment. FIG. 13 also shows a timing relationship among the driving pulses, that is, the drain voltage DRN, the reset pulse RST, and the transfer pulse TRF, of a selection row (assumed to be an n-th row) during a pixel reading period.

In the timing chart of FIG. 13, the timing relationship among the drain voltage DRN, the reset pulse RST, and the transfer pulse TRF is basically the same as that of a case according to the conventional technology (see FIG. 17). A time t51 indicates a timing at which a reset level is received, and a time t52 indicates a timing at which a signal level is received.

Furthermore, in the method of driving the solid-state imaging device according to this embodiment, as a result of setting the voltage value on the "H" level side of the reset pulse RST to be higher than the voltage value (=the voltage of the power-supply voltage) on the "H" level side of the drain voltage DRN, the operation margin is ensured without lowering the threshold values of the amplifier transistor 23 and the resetting transistor 24, and the electrical current during the non-selection period is reliably shut off. In this case, since the electrical current is shut off for all the pixels, the electrical potential of the vertical signal line 27 is a voltage, such as 0 V, at which the bias-current source 34 (see FIG. 8) does not cause a bias current to flow.

If each of the threshold values of the amplifier transistor 23 and the resetting transistor 24 is higher than or equal to 0.2 V, preferably, approximately 0.4 to 0.5 V, the electrical current can be shut off. Furthermore, when the voltage value on the "H" level side of the reset pulse RST is set to be higher than the voltage value on the "H" level side of the drain voltage DRN, inside the solid-state imaging device, the voltage may be generated by stepping up the voltage value of the power-supply voltage by using a stepping-up circuit or the voltage may be supplied externally.

As described above, in the solid-state imaging device according to the fifth embodiment, as a result of setting the threshold values of the amplifier transistor 23 and the resetting transistor 24 to be higher than or equal to 0.2 V and setting the voltage value on the "H" level side of the reset pulse RST to be higher than the voltage value on the "H" level side of the drain voltage DRN, the electrical current during the non-selection time is reliably shut off, and the bias current does not flow to the vertical signal line 27. As a result, defective pixels due to non-selection hot carrier white points can be virtually eliminated.

Figure 15:
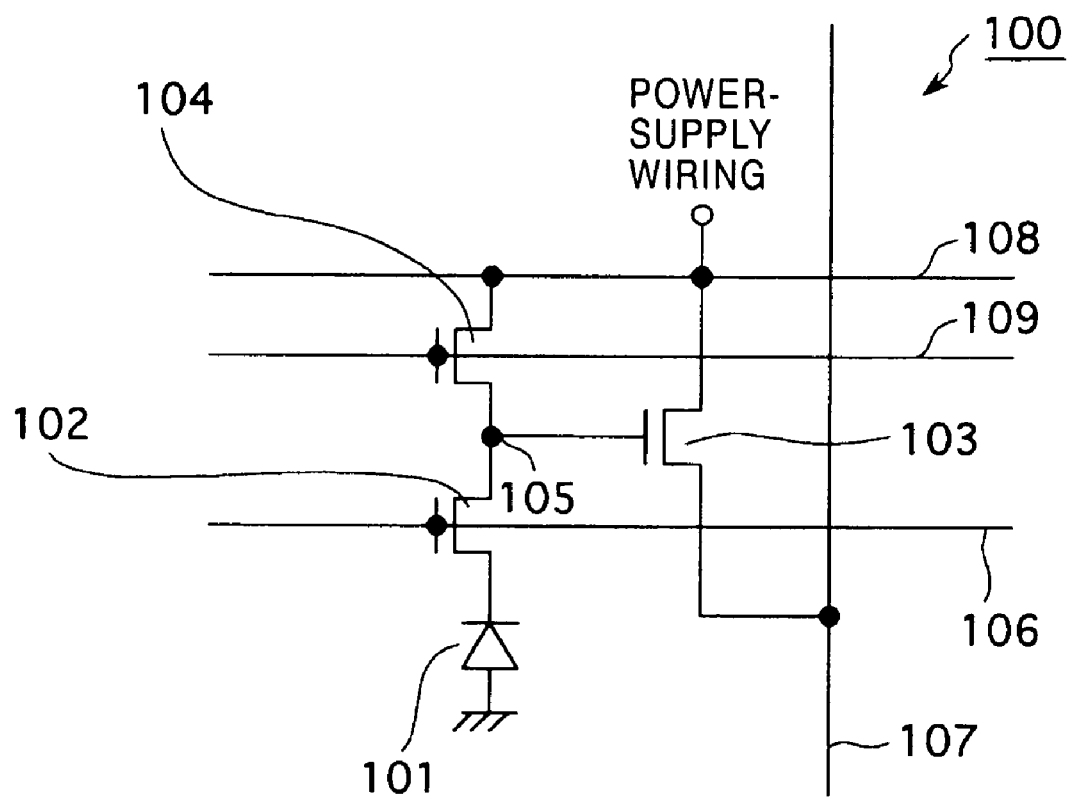
FIG. 15 is a circuit diagram showing a first example of a pixel circuit of a three-transistor configuration.
Figure 16:
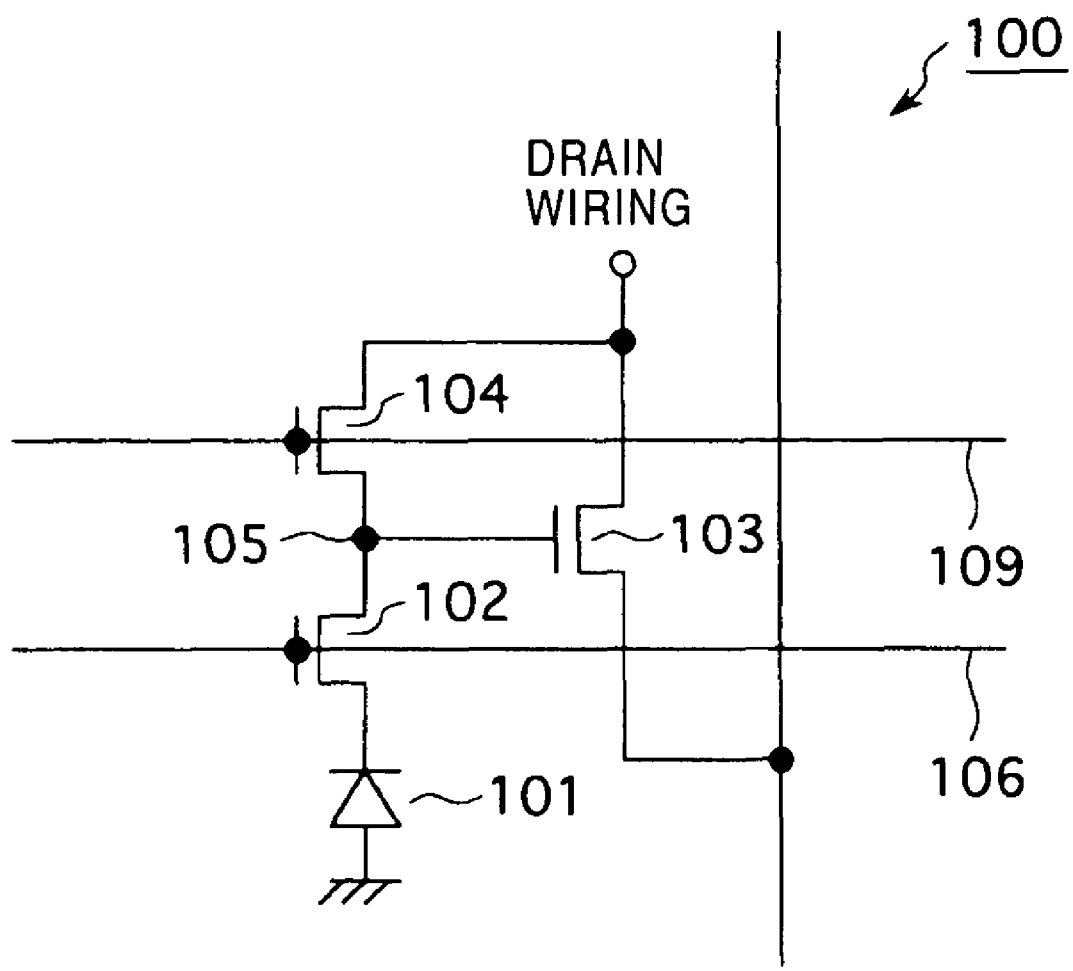
FIG. 16 is a circuit diagram showing a second example of the pixel circuit of a three-transistor configuration.

The embodiments have been discussed above by using as an example a case in which the driving method is applied to the pixel configuration shown in FIG. 2, that is, pixels of the configuration in which the drain side of the amplifier transistor and the drain side of the resetting transistor are connected in common to the drain wiring. However, the driving method is not restricted to this example, and can also be applied to a pixel configuration shown in Fig. 15, that is, pixels of the configuration in which the drain side of the amplifier transistor is connected to the power-supply wiring and the drain side of the resetting transistor is connected to the drain wiring.

That is, also, in this type of pixel, in the driving by the driving method according to the conventional technology (the driving method based on the timing chart of FIG. 17), non-selection hot carrier white points occur for the same reasons as those in the case of pixels of the configuration in which the drain sides of the amplifier transistor and the resetting transistor are connected in common to the drain wiring. By applying the driving method according to each of the above-described embodiments, the occurrence of non-selection hot carrier white points can be suppressed.

The size of the pixel of the type in which the drain side of the amplifier transistor is connected to the power-supply wiring and the drain side of the resetting transistor is connected to the drain wiring is greater than that of the configuration shown in FIG. 2. However, since there is no need to drive the wiring over the entire surface of the pixel section, this is advantageous from the viewpoint of increasing the number of pixels. Also, when the driving method is applied to this pixel, driving can be performed by the same driving method as the driving method according to each of the above-described embodiments. That is, the same pulse voltage as the drain voltage DRN in the pixel of FIG. 2 may be supplied to the drain wiring which is connected to only the resetting transistor and which extends in the row direction. However, it is only for the selection row that the drain voltage is supplied to the drain wiring.

Figure 14:
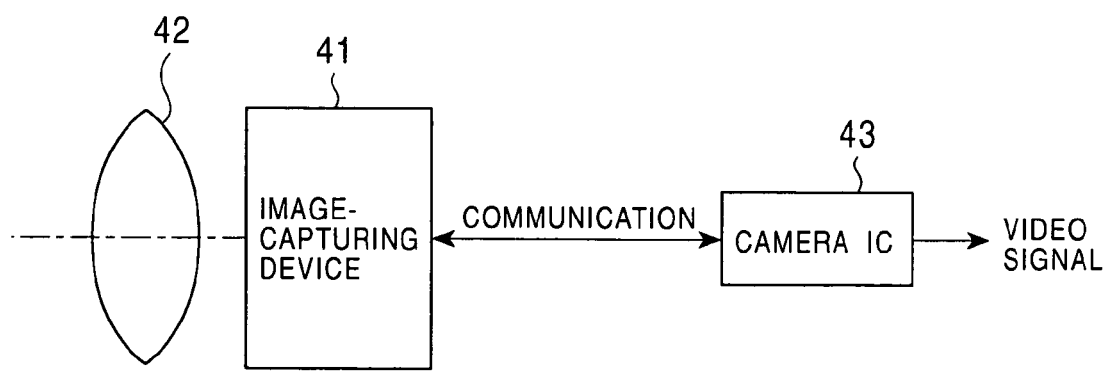
FIG. 14 is a block diagram showing the overview of the configuration of a camera apparatus according to the present invention.

FIG. 14 is a block diagram showing the overview of the configuration of a camera apparatus (image-capturing apparatus) according to the present invention. As can be seen from FIG. 14, the camera apparatus includes an image-capturing device 41; an optical system for guiding incidence light into the pixel area of the image-capturing device 41, for example, a lens 42 for forming incidence light (image light) into an image on the image-capturing plane; a camera IC 43 for controlling the image-capturing device 41 and for processing a signal from the image-capturing device 41; and others.

In this camera apparatus, as the image-capturing device 41, the solid-state imaging device according to the first to fifth embodiments, that is, the MOS-type solid-state imaging device of a three-transistor configuration in which the unit pixel 11 has, in addition to the optoelectric transducer (for example, photodiode) 21, the transfer transistor 22, the amplifier transistor 23, and the resetting transistor 24, is used.

The camera IC 43 communicates with the image-capturing device 41 and controls the image-capturing device 41. For example, the control of the electronic shutter and the control of the reading mode are performed. Furthermore, the camera IC 43 processes signals from the image-capturing device 41. For example, color-related processing such as white balance, and the compression of signals are performed. In this example, a frame memory and a ROM used for image processing are contained in the camera IC 43. Alternatively, these may be formed as other chips.

As described above, according to this camera apparatus, as a result of using the MOS-type solid-state imaging device according to the first to fifth embodiments as the image-capturing device 41 and the camera IC (driving circuit 43 for driving the image-capturing device, in the MOS-type solid-state imaging device, defective pixels due to non-selection hot carrier white points can be virtually eliminated. Therefore, it is possible to obtain a captured image with a high image quality.

The camera apparatus of the above-described configuration according to the present invention may be used as a camera module incorporated in electrical devices, such as portable phones and PCs (Personal Computers).

What is claimed is:

1. A camera apparatus comprising:
   a solid-state imaging device having a pixel section comprised of a plurality of unit pixels, each unit pixel having a transfer transistor for transferring a signal of an optoelectric transducer to a floating diffusion section, an amplifier transistor for outputting a signal of said floating diffusion section to a signal line, and a resetting transistor for resetting said floating diffusion section;

an opticalsy system for guiding incident light onto pixels of said solid-state imaging device; and a driving means which selects pixels in each column and which selects a pixel during a read-out period for a currently selected row by controlling voltages of a drain and a gate of said resetting transistor of the selected pixel and for substantially reducing a bias current flowing to a low channel pixel of each column during a non-reading period by causing the bias current to flow to a location other than low channel pixels of the imaging device.

2. A camera apparatus comprising:

a solid-state imaging device having a pixel section comprising a plurality of unit pixels, each unit pixel having a transfer transistor for transferring a signal of an optoelectric transducer to a floating diffusion section, an amplifier transistor for outputting a signal of said floating diffusion section to a signal line, and a resetting transistor for resetting said floating diffusion section, and means for causing a bias current supplied to said signal line to flow to a location other than image information generating pixels of said pixel section during a non-reading period and thereby substantially reducing a bias current flowing to a low channel pixel of each column during the non-reading period;

an optical system for guiding incident light onto said pixel section of said solid-state imaging device; and driving means which selects each pixel of said pixel section by controlling voltages of the drain and the gate of said resetting transistor and which causes the bias current to flow to a location other than low channel pixels of the imaging device.

3. A camera apparatus comprising:

a solid-state imaging device having a pixel section comprised of a plurality of unit pixels, each unit pixel having a transfer transistor for transferring a signal of an optoelectric transducer to a floating diffusion section, an amplifier transistor for outputting a signal of said floating diffusion section to a signal line, and a resetting transistor for resetting said floating diffusion section, a bias current source for supplying a bias current to each pixel through said signal line, and means for shutting off the supply of said bias current to said signal line during a non-reading period of pixels comprising a switching element between the bias current source and the signal line for disconnecting the bias current source from the signal line during the non-reading period and thereby substantially reducing a bias current flowing to a low channel pixel of each column during the non-reading period;

an optical system for guiding incident light onto said pixel section of said solid-state imaging device; and a driving means which selects each pixel during a read-out period of a currently selected row by controlling the voltages of the drain and the gate of said resetting transistor and which causes the bias current to flow to a location other than the low channel pixels of the imaging device.

4. A camera apparatus comprising:

a solid-state imaging device having a pixel section comprised of a plurality of unit pixels, each unit pixel having a transfer transistor for transferring a signal of an optoelectric transducer to a floating diffusion section, an amplifier transistor for outputting a signal of said floating diffusion section to a signal line, and a resetting transistor for resetting said floating diffusion section;

an optical system for guiding incident light onto said pixel section of said solid-state imaging device; and a driving means for sequentially selecting pixels in each column and selecting a pixel during a read-out period of a currently selected row by controlling the drain and gate voltages of said resetting transistor and causing the drain voltage of said resetting transistor to be an intermediate voltage between a power-supply voltage level and a ground level during a subsequent non-reading period of pixels, and for causing the bias current to flow to a location other than the low channel pixels of the imaging device.

5. A camera apparatus including a solid-state imaging device having a pixel section comprising a plurality of unit pixels, each unit pixel having a transfer transistor for transferring a signal of an optoelectric transducer to a floating diffusion section, an amplifier transistor for outputting a signal of said floating diffusion section to a signal line, and a resetting transistor for resetting said floating diffusion section;

an optical system for guiding incident light onto said pixel section of said solid-state imaging device; and a driving means for selecting each pixel of said pixel section during a read-out period of a currently selected row by controlling the drain and gate voltages of said resetting transistor and for providing a resetting pulse whose voltage value on a high level side is higher than the voltage value of the power-supply voltage to the gate of said resetting transistor during a reset time and which causes the bias current to flow to a location other than the low channel pixels of the imaging device during a non-reading period.

* * * * *